(12) United States Patent
Kobayashi et al.

(10) Patent No.: US 7,852,063 B2
(45) Date of Patent: Dec. 14, 2010

(54) INTEGRATED POWER DETECTOR WITH TEMPERATURE COMPENSATION FOR FULLY-CLOSED LOOP CONTROL

(75) Inventors: Bun Kobayashi, Cypress, CA (US); Liyang Zhang, West Hills, CA (US); Mau-Chung Frank Chang, Los Angeles, CA (US); Pei-Ming Daniel Chow, Los Angeles, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 118 days.

(21) Appl. No.: 12/133,297

(22) Filed: Jun. 4, 2008

(65) Prior Publication Data

US 2009/0302830 A1    Dec. 10, 2009

(51) Int. Cl.
*G01R 5/22* (2006.01)
(52) U.S. Cl. ........................ 324/105
(58) Field of Classification Search ......... 324/105–115; 330/272
See application file for complete search history.

(56) References Cited

U.S. PATENT DOCUMENTS

| | | | |
|---|---|---|---|
| 4,066,965 A * | 1/1978 | Schultz et al. | 375/295 |
| 4,485,348 A | 11/1984 | Perkins | |
| 5,196,806 A * | 3/1993 | Ichihara | 330/137 |
| 5,497,125 A * | 3/1996 | Royds | 330/290 |
| 6,118,985 A * | 9/2000 | Kawakyu et al. | 455/78 |
| 6,531,860 B1 * | 3/2003 | Zhou et al. | 324/105 |
| 6,727,754 B2 * | 4/2004 | Dupuis et al. | 330/254 |
| 7,042,285 B2 * | 5/2006 | Parkhurst et al. | 330/140 |
| 7,071,783 B2 * | 7/2006 | Ichitsubo et al. | 330/285 |
| 7,190,935 B2 * | 3/2007 | Hecht | 455/127.1 |
| 7,253,681 B2 * | 8/2007 | Ichitsubo et al. | 330/140 |
| 7,440,734 B1 * | 10/2008 | Jones et al. | 455/115.1 |
| 2007/0249310 A1 * | 10/2007 | Zhang | 455/234.1 |

OTHER PUBLICATIONS

Yamamoto, et al., "A Current-Mirror-Based GaAs-HBT RF Power Detector for Wireless Applications," IEEE CSIC Symposium, Portland, Oregon, Oct. 2007, pp. 227-230.

* cited by examiner

*Primary Examiner*—Ha Tran T Nguyen
*Assistant Examiner*—Richard Isla Rodas
(74) *Attorney, Agent, or Firm*—DLA Piper LLP (US)

(57) ABSTRACT

An amplifier circuit comprises a detection power input circuit for receiving an RF signal, and a bias circuit that includes an output for generating a bias signal in response to a reference control voltage. The power detector further comprises a detection circuit for generating a power control voltage having a voltage characteristic that offsets temperature characteristics of the received RF signal. The amplifier circuit further comprises a power amplifier coupled to the bias circuit. The power amplifier includes a driver stage providing the RF signal. The detection circuit compensates temperature variation of the inputted detection voltage of the received RF signal.

4 Claims, 5 Drawing Sheets

INTEGRATED POWER DETECTOR WITH TEMPERATURE COMPENSATION FOR FULLY-CLOSED LOOP CONTROL

TECHNICAL FIELD

The present invention generally relates to power detectors, and more particularly, to power detectors having temperature compensation.

BACKGROUND

To monitor output power of a power amplifier, the input of a power detector typically is connected to the output of the power amplifier. That is, the input power of the power detector is the output power of the power amplifier. Recently, however, the input of the power detector is connected to an intermediate stage of the power amplifier. This approach may avoid the influence from mismatch of an antenna coupled to the output of the power amplifier, but the detected power is not the actual output power of the power amplifier. Furthermore, the output power of the power amplifier varies with temperature.

SUMMARY

In one aspect, an amplifier circuit comprises a detection power input circuit for receiving an RF signal, and a bias circuit that includes an output for generating a bias signal in response to a reference control voltage. The power detector further comprises a detection circuit for generating a power control voltage having a voltage characteristic that offsets temperature characteristics of the received RF signal.

In another aspect, the amplifier circuit further comprises a power amplifier coupled to the bias circuit. The power amplifier includes a driver stage providing the RF signal.

In yet another aspect, the detection circuit compensates temperature variation of the inputted detection voltage of the received RF signal.

DETAILED DESCRIPTION

Figure 1:
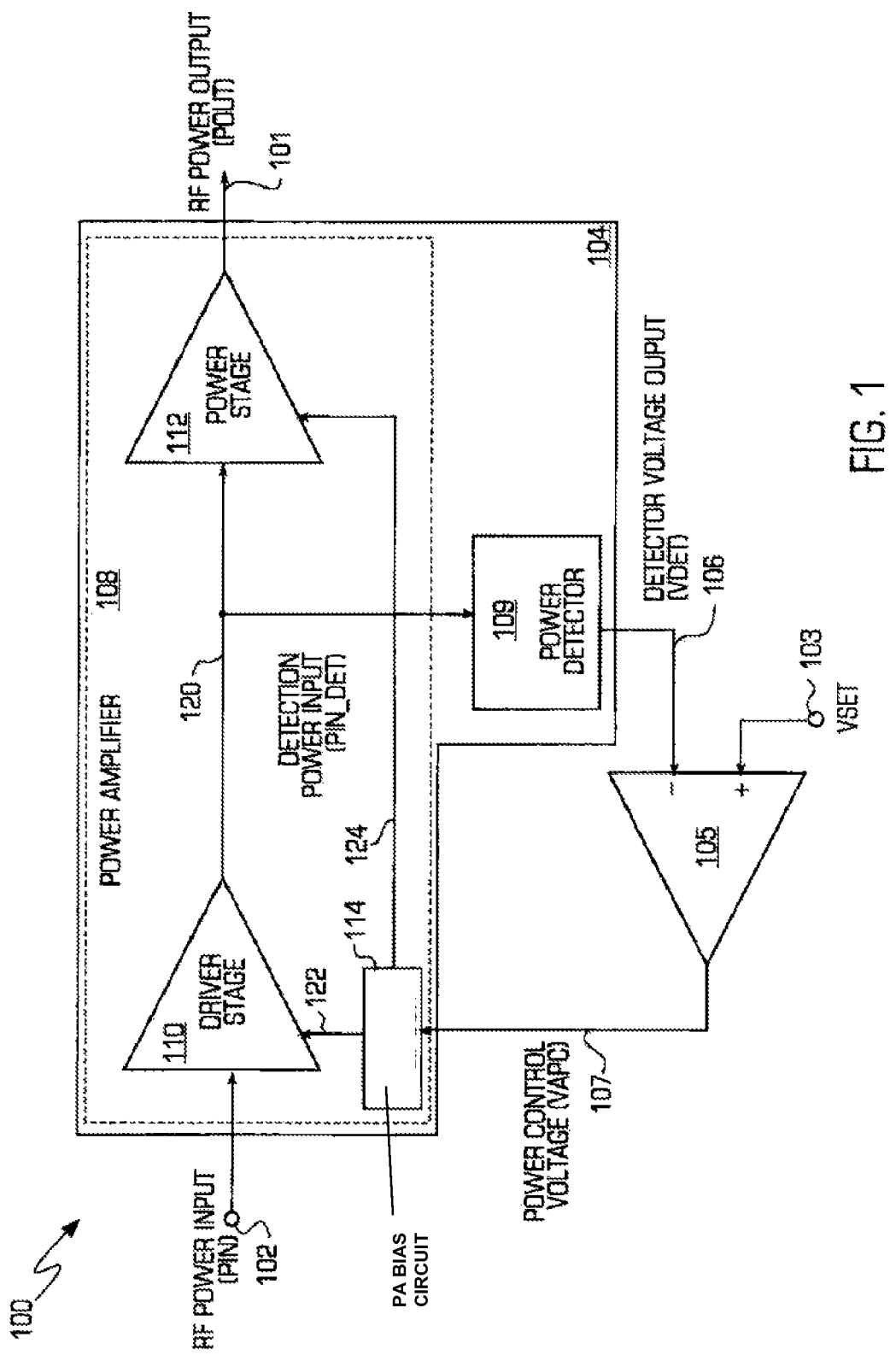
FIG. 1 is a schematic diagram illustrating a full closed-loop amplifier circuit with a power detector.

FIG. 1 is a schematic diagram illustrating an amplifier circuit 100. The amplifier circuit 100 may be a full closed loop amplifier circuit. The amplifier circuit 100 provides an amplified RF power output 101 in response to an RF power input 102 using a set voltage (Vset) 103 for controlling a threshold voltage for feedback control of the amplifier circuit 100. The set voltage 103 may be received from an external system for controlling the output power level of the amplified RF power output 101. The amplifier circuit 100 provides temperature compensation for the feedback control.

The amplifier circuit 100 comprises a power circuit 104 and a power control circuit 105. In one embodiment, the power control circuit 105 comprises a comparator. For the sake of illustration, the power control circuit 105 is referred to hereinafter as comparator 105. In one embodiment, the comparator 105 is a differential amplifier. The comparator 105 compares the set voltage 103 to a detector voltage output 106 from the power detector 104 and provides a power control voltage 107 to the power detector circuit 104 in response to the difference between the set voltage 103 and the detector voltage output 106. The power detector 104 sets a bias voltage that is temperature compensated in response to the power control voltage 107.

The power circuit 104 comprises a power amplifier 108 and a power detector 109. The power amplifier 108 comprises a driver stage 110, a power stage 112, and a bias circuit 114. The driver stage 110 provides a detected power input signal 120 to the power stage 112 and the power detector 109. The power detector 109 generates the detector voltage output 106 in response to the detected power input 120. The power detector 109 compensates for the temperature variation from the power amplifier 108 as well as the power detector 109.

The power amplifier bias circuit 114 provides a first bias signal 122 and a second bias signal 124 to the driver stage 110 and the power stage 112, respectively, in response to the power control voltage 107. In one embodiment, the bias signals 122 and 124 are transistor base voltages. The power stage 112 provides the RF power output 101 in response to the detection power input signal 120 and the second signal 124.

Although the power detector 109 is coupled interstage of the power amplifier 108, the power detector 109 monitors the real output power of the power amplifier 108. The power detector 109 provides the detector voltage output 106 as a function of the RF power output 101. The detector output voltage (Vdet) 106 is applied to an input of the comparator 105, which may have differential inputs. The other input of the comparator 105 is the set voltage (Vset) 103. The power control voltage (Vapc) 107 from the comparator 105 is applied back to control the gain of the power amplifier 108 by adjusting its bias. For example, the comparator 105 outputs a higher power control voltage (Vapc) 107 by comparing the set voltage (Vset) 103 with the detector output voltage (Vdet) 106 if the RF power output 101 is lower, so that RF power output 101 becomes higher The power amplifier 108 and the power detector 109 may be integrated in the same die to obtain smaller size and reduce cost. In one embodiment, an amplifier circuit 100 for a GSM system may have dimensions of 5×5 millimeters or 6×6 millimeters. In one embodiment, the comparator 105 is formed on a power control die. The power amplifier 108 and the power detector 109 may be made of the same manufacture process such as GaAs material, and with heterojunction bipolar transistors (HBTs), while the power control die that includes the comparator 105 may be made of regular silicon semiconductor, such as CMOS devices.

The amplifier circuit 100 may be used in wireless communication systems, such as GSM cell phones, WLANs, WiMax (Worldwide Interoperability for Microwave Access). The amplifier circuit 100 also may be used in microwave radars, and optical signal transmission.

Figure 2:
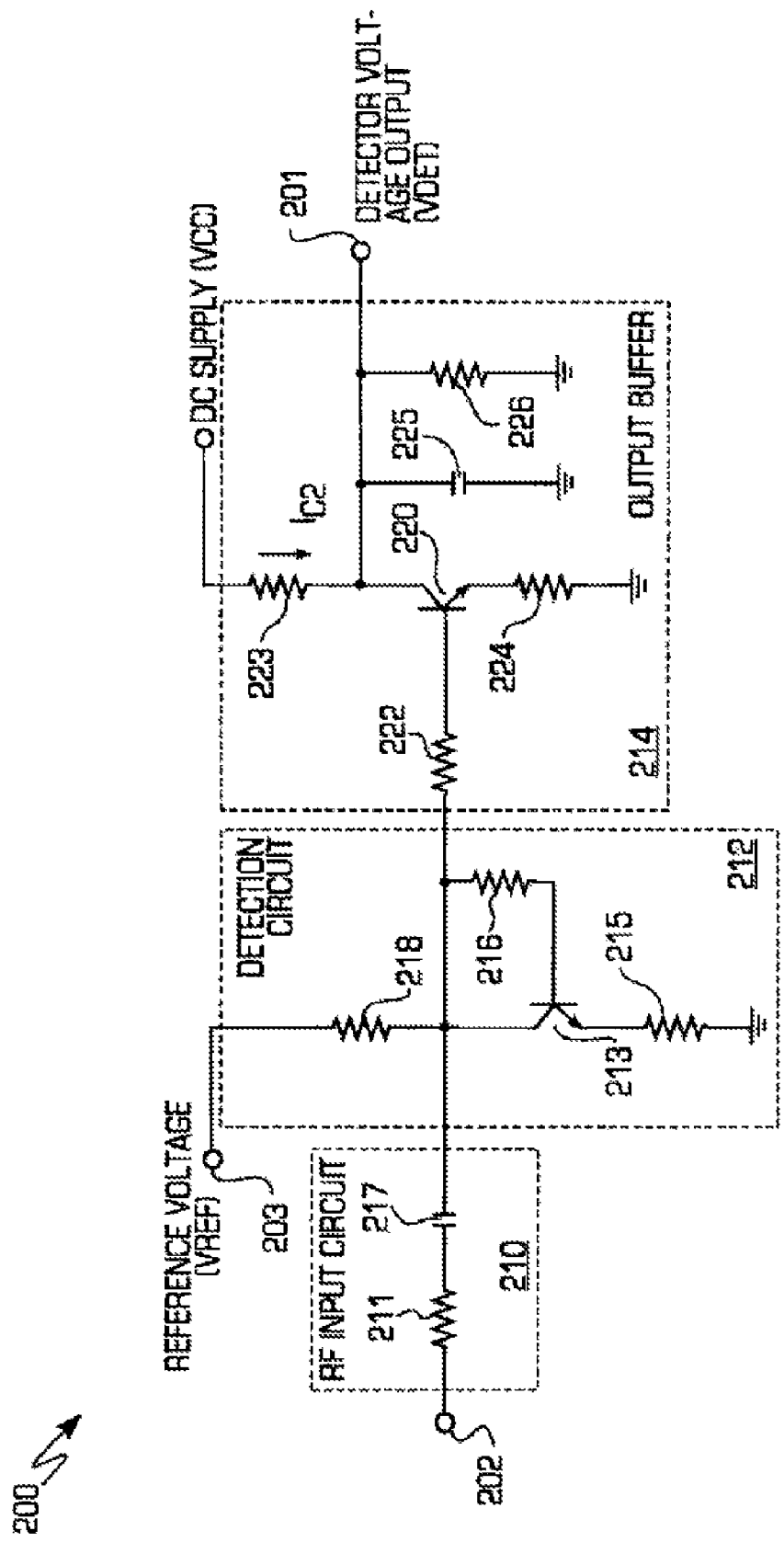
FIG. 2 is a schematic diagram illustrating a conventional power detector.

FIG. 2 is a schematic diagram illustrating a conventional power detector 200. The power detector 200 includes a detector voltage output terminal 201 for providing a detector voltage output signal in response to an RF signal applied to a detected power input 202 applied to a detected RF power input terminal 202. A reference voltage terminal 203 receives a reference voltage for setting a threshold for the power detector 200. The power detector 200 comprises an RF input circuit 210, a detection circuit 212 and an output buffer 214. The RF input circuit 210 provides DC current limiting and capacitance filtering of the detection power input 202, which is applied to the detection circuit 212. The RF input circuit 210 comprises an input resistor 211 and an input capacitor 212 coupled in series between the detection power input terminal 202 and the detection circuit 212. The detection circuit 212 comprises a bipolar transistor 213, a collector resistor 218 coupled between a reference voltage terminal 203 and the collector of the bipolar transistor 213, an emitter resistor 215 coupled between the emitter of the bipolar transistor 213 and ground, and a base resistor 216 coupled between the collector and base of the bipolar transistor 213.

The output buffer 214 comprises a bipolar transistor 220, an isolation resistor 222, a collector resistor 223, an emitter resistor 224, a filter capacitor 225, and a resistor 226. The bipolar transistors 220 and 213 are arranged in a current mirror configuration so that the collector current $I_{C2}$ of the bipolar transistor 220 mirrors the current on the collector of the bipolar transistor 213 and the detection circuit 212. The output buffer 214 amplifies the DC voltage.

The current-mirror formed of the bipolar transistors 213 and 220 only compensates bias current over temperature. The current mirror does not compensate for the RF inputted detection power. Further, the DC supply current VCC is rectified in temperature because the detector output voltage 201 can be described as:

$$Vdet=Vcc-I_c R_{223}$$

Where the term Vcc is the supply voltage, the term $I_c$ is the current through the resistor 223, and the term $R_{223}$ is the resistance of the resistor 223. The detection circuit 212 provides a RF to DC conversion that causes the bipolar transistor 213 to operate in a nonlinear region.

Figure 3:
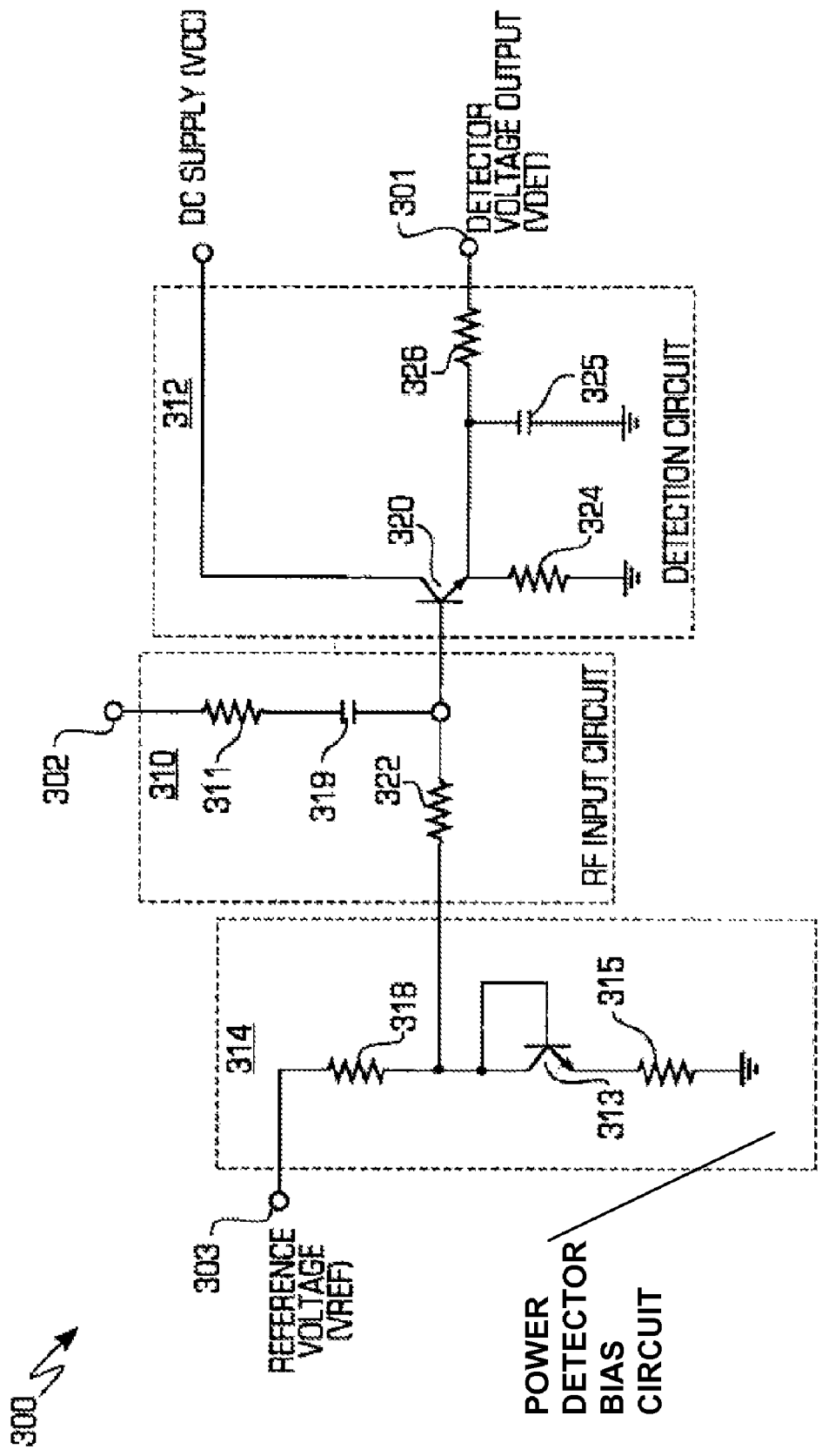
FIG. 3 is a schematic diagram illustrating one embodiment of a power detector of the amplifier circuit of FIG. 1.

FIG. 3 is a schematic diagram illustrating a power detector 300. The power detector 300 includes a detector voltage output terminal 301 for providing a detector voltage output signal in response to an RF power signal applied to a detected RF power input terminal 302. A reference voltage terminal 303 receives a reference voltage for setting a threshold for the power detector 300.

The power detector 300 comprises an RF input circuit 310, a detection circuit 312 and a power detector bias circuit 314. The power detector bias circuit 314 sets a bias voltage for the detection circuit 312, which is modified by the RF input signal 310 in response to a detection power input 302. The detector voltage output 301 is independent of the DC power supply voltage Vcc.

The power detector bias circuit 314 comprises a collector resistor 318, a diode connected bipolar transistor 313, and an emitter resistor 315 coupled in series between the reference voltage terminal 303 and ground. The RF input circuit 310 comprises an input resistor 311, an input capacitor 319, and an isolation resistor 322 coupled in series between the detection power input terminal 302 and the collector of the bipolar transistor 313.

The detection circuit 312 comprises a bipolar transistor 320 including a base coupled to the node formed between the isolation resistor 322 and the input capacitor 319, and including a collector coupled to the DC supply voltage VCC. The isolation resistor 322 provides isolation of the rise time of the bipolar transistor 320. The base of the bipolar transistor 320 is at a DC voltage plus an RF input controlled by the high power input 302. The current mirror formed at the bipolar transistors 313 and 320 provides DC compensation for the power amplifier 108. The bipolar transistor 320 is arranged as an emitter follower for enveloping the RF signal.

The detection circuit 312 further comprises an emitter resistor 324, a filter capacitor 325 and an isolation resistor 326. The emitter resistor 324 is coupled between the emitter of the bipolar transistor 320 and ground. The isolation resistor 326 is coupled between the detector voltage output terminal 301 and the emitter of the bipolar transistor 320. The filter capacitor 325 is coupled between the emitter of the bipolar transistor 320 and ground. The emitter resistor 324 provides a DC output on the detector voltage output 301. The filter capacitor 325 filters the RF frequency. In one embodiment, the RF frequency is approximately 800 MHz. The isolation resistor 326 provides additional filtering of the RF. In one embodiment, the current mirror formed at the bipolar transistors 313 and 320 has an input bias of a few milliamps if there is no RF circuit. The RF signal causes the bipolar transistor 320 to operate in a nonlinear region.

The RF power is applied to the base of the bipolar transistor 320 via the RF input circuit 310. Due to non-linearity, the current of the bipolar transistor 320 includes contributions of RF frequency and DC voltage. The DC is proportional to the amplitude (envelope) of the RF input power. The capacitor 325 and the resistor 324 filter the RF frequency and output the DC voltage.

Figure 4:
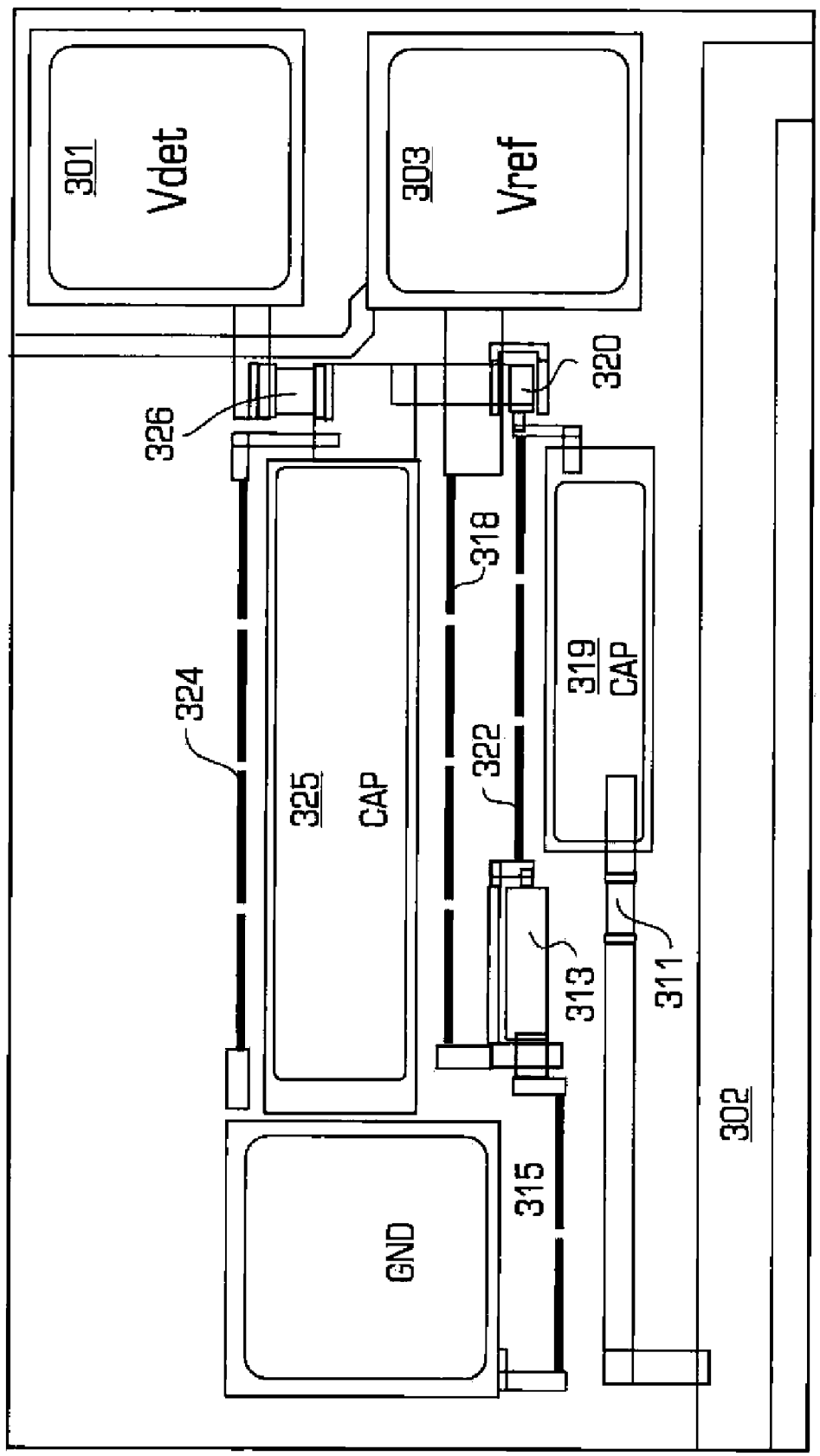
FIG. 4 is a top plan view illustrating one embodiment of an integrated circuit layout of the power detector of FIG. 3.

FIG. 4 is a top plan view illustrating an embodiment of a layout of the power detector 109.

In an illustration embodiment, the input resistor 311 and the isolation resistor 322 have resistances of 100 and 4,000 ohms, respectively. The input capacitor 319 has a capacitance of 2 picofarads. The coupling coefficient is around −15 dB. The power detector bias circuit 314 is a current mirror bias circuit combined with the bipolar transistor 320. The resistors 318 and 315 have resistances of 4,000 and 2,000 ohms, respectively. The bipolar transistor 313 is a HBT and has an emitter area of 160 square microns. The emitter area of the bipolar transistor 320 is 20 square mirrors, and is biased to a low current of about 0.1-0.2 milliamps. The emitter resistor 324 and the isolation resistor 326 have resistances of 4,000 and 50 ohms, respectively. The filter capacitor 325 has a capacitance of 5 picofarads. The DC supply (VCC) terminal is shared with the reference voltage (VREF) terminal 303 in this layout example.

Figure 5:
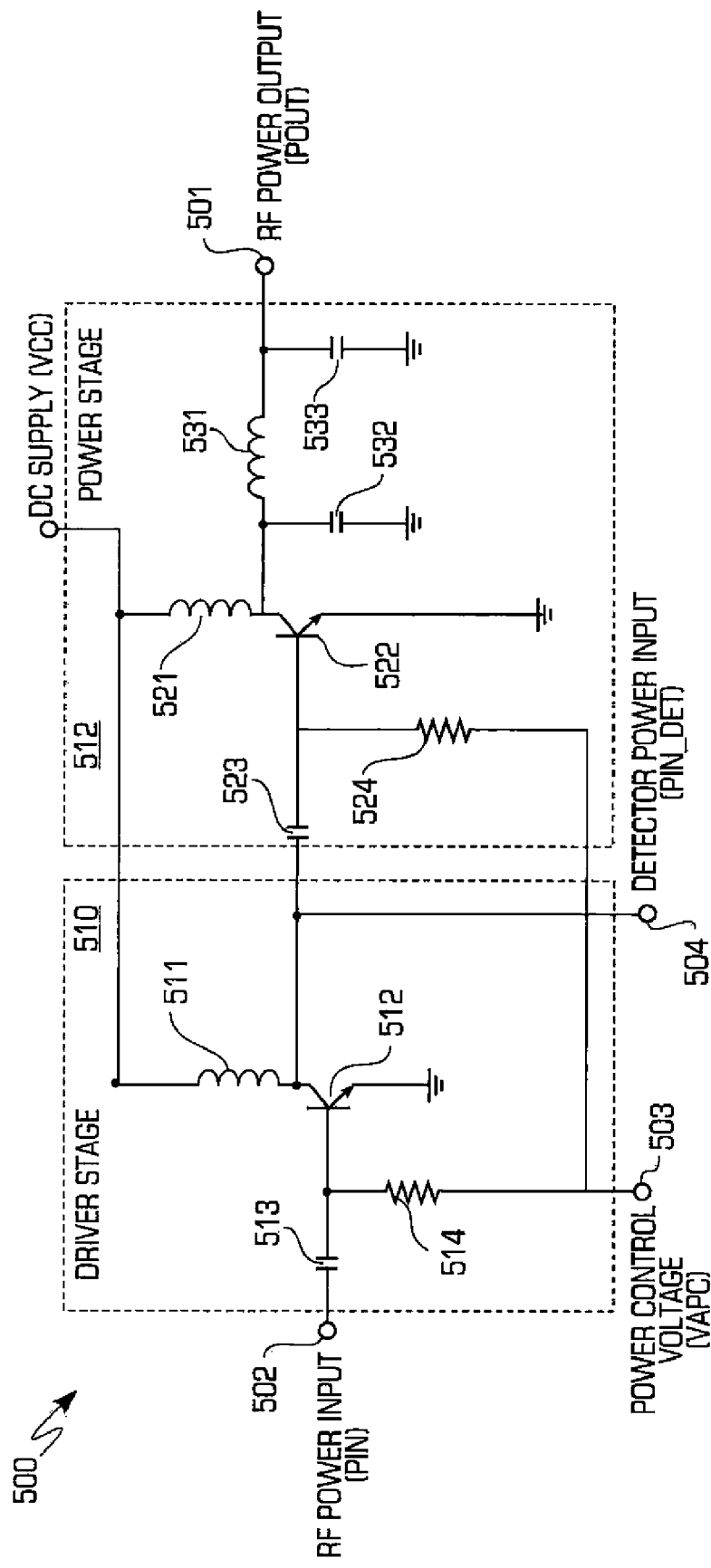
FIG. 5 is a schematic diagram illustrating a power amplifier of the amplifier circuit of FIG. 1.

FIG. 5 is a schematic diagram illustrating a power amplifier 500, which may be used for part of the power amplifier 108 (FIG. 1). The power amplifier 500 generates an RF output signal on the output terminal 501 in response to an RF power signal applied to an RF power input terminal 502, a power control voltage on a power control terminal 503, and a detector power signal applied to a detector power signal input terminal 504. The power amplifier 500 comprises a driver stage 510, which may be used for part of driver stage 110 (FIG. 1) and a power stage 512, which may be used for part of the power stage 112 (FIG. 1).

The driver stage 510 comprises an inductor 511 and a bipolar transistor 512 coupled in series between a DC supply voltage VCC and ground. The driver stage 510 further comprises an input capacitor 513 coupled between the RF power input 502 and the base of the bipolar transistor 512 to filter the RF power. A base resistor 514 is coupled between the power control voltage terminal 503 and the base of the bipolar transistor 512 to bias the bipolar transistor 512. The power control voltage terminal 503 receives the power control voltage (Vapc) 107 from the comparator 105 (FIG. 1). The detector power input terminal 504 provides the detected RF power to the detected RF power input terminal 302 (FIG. 3).

The power stage 512 comprises an inductor 521 and a bipolar transistor 522 coupled in series between the DC supply VCC and ground. An input capacitor 523 is coupled between the collector of the bipolar transistor 512 of the driver stage 510 and the base of bipolar transistor 522 of the power stage 512. A base resistor 524 couples the power control voltage terminal 503 to the base of the bipolar transistor 522 to bias the base thereof. An inductor 521 is coupled between the collector of the bipolar transistor 522 and the RF output terminal 501. A filter capacitor 532 is coupled between the collector of the bipolar transistor 522 and ground. A filter capacitor 533 is coupled between the RF power output terminal 501 and ground to form an output filter of the power stage 512. In one embodiment, the power amplifier 500 is used in a GSM system. In one embodiment the power amplifier 500 may be formed of an InGaP/GaAs HBT.

A power control loop of the amplifier circuit 100 includes the power detector 109 that provides a detector output voltage 106, which is independent of temperature in a certain RF power range. In one embodiment, a power amplifier 108 for a Global System for Mobile communications (GSM) has an RF output power variation of the power output 101 less than +/−2 dB at −20 to 85 degrees C., at a power range of 14 to 32 dBm.

Without temperature compensation, the RF power output 101 of a power amplifier 108 strongly depends on temperature due to the current temperature variation of the HBT transistors, such as the collector current which varies with temperature as follows:

$$Ic = Is\, \exp(qVbe/nkT),$$

Where the term Is is the saturation current, the term q is charge, the term Vbe is base-emitter voltage, the term n is concentration of carriers in the HBT, the term k is the Boltzmann's constant, and the term T is temperature of the bipolar transistor. For example, the output power may have more than 10 dB error if the power is adjusted by the base-emitter voltage Vbe without control.

The power detector 109 cancels the temperature behavior of the inputted detection power 302 by having a temperature coefficient that is opposite that of the power amplifier 108.

In one embodiment, the inputted detection power 302 has the same temperature behavior as that of the output power 504 of the driver stage 510, which appears as a negative temperature coefficient compared with the output power of the power amplifier 500 (such as InGaP/GaAs HBT, Si bipolar transistors in the power amplifier). The power detector 109 uses the negative temperature coefficient of Vbe of bipolar transistors (such as InGaP/GaAs HBT, or Si). The detector output voltage 106 is used as a part of the input voltage, which is rectified by the detection input 302.

The cancellation of temperature variation of the power detector 109 is now described. The power detector 109 has a temperature coefficient that is opposite of the detection power 120.

The DC Detector output voltage (Vdet) 106 including the detected envelope voltage of RF power is:

$$Vdet = Vb2 - Vbe2$$

Where Vb2 is the voltage on the base of the bipolar transistor 320, and Vbe2 is the base-emitter voltage of the bipolar transistor 320. Accordingly, the change in the detector output power 106 with a corresponding increment in temperature is given by:

$$\Delta Vdet(T) = \Delta Vb2(T) - \Delta Vbe2(T)$$

In one embodiment, the temperature coefficient of $\Delta Vbe2(T)$ is about −2 mV/°K for a InGaP/GaAs HBT with an ideal current source load (e.g., the resistor 320).

In the power detector 109, $\Delta Vb2(T)$ is mainly caused from the inputted detector power 120, and is negative. The voltage difference $\Delta Vbe2(T)$ is also negative, but the magnitude of $\Delta Vbe2(T)$ may be controlled by the equivalent load of the bipolar transistor 320. For example, using different resistor value and bipolar transistor size changes the temperature control of the current mirror of the bipolar transistors 313 and 320.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A power detector comprising:
   a detection power input circuit for receiving an RF signal;
   a bias circuit including an output for generating a bias signal in response to a reference control voltage;
   a detection circuit for generating a power control voltage having a voltage characteristic that offsets temperature characteristics of the received RF signal, the detection circuit forming a current mirror with the bias circuit.
   wherein a power amplifier is coupled to the bias circuit, the power amplifier comprising a driver stage and a power stage with the driver stage providing said RF signal;
   wherein the driver stage comprises:
      a first capacitor including a first terminal for receiving an RF power signal and including a second terminal,
      a first resistor including a first terminal coupled to the second terminal of the first capacitor and including a second terminal coupled to a power control voltage terminal for receiving the power control voltage from the detection circuit,
      a first transistor including a base coupled to the second terminal of the first capacitor, including an emitter coupled to a ground terminal and including a collector coupled to a detector power input terminal for providing the RF signal to the detection power input circuit, and
      a first inductor including a first terminal coupled to the collector of the first transistor and including a second terminal coupled to a voltage supply terminal,
   wherein the power stage comprises:
      a second capacitor including a first terminal coupled to the emitter of the first transistor and including a second terminal,
      a second resistor including a first terminal coupled to the second terminal of the second capacitor and including a second terminal coupled to the second terminal of the first resistor,
      a second transistor including a base coupled to the second terminal of the second capacitor, including an emitter coupled to the ground terminal, and including a collector,
      a second inductor including a first terminal coupled to the collector of the second transistor and including a second terminal coupled to the voltage supply terminal, and
      a filter coupled between the collector of the second transistor and an RF power output terminal for providing an RF power output signal.

2. The power detector of claim 1 wherein the filter comprises:
   a third capacitor including a first terminal coupled to the collector of the second transistor and including a second terminal coupled to the ground terminal, a third inductor including a first terminal coupled to the collector of the second transistor and including a second terminal coupled to the RF power output terminal, and a fourth capacitor including a first terminal coupled to the second terminal of the third inductor and including a second terminal coupled to the ground terminal.

3. A power detector comprising:

a detection power input circuit for receiving an RF signal;

a bias circuit including an output for generating a bias signal in response to a reference control voltage;

a detection circuit for generating a power control voltage having a voltage characteristic that offsets temperature characteristics of the received RF signal, the detection circuit forming a current mirror with the bias circuit.

wherein a power amplifier is coupled to the bias circuit, the power amplifier comprising a driver stage providing said RF signal;

wherein the detection power input circuit comprises:
   a first resistor including a first terminal for receiving the RF signal and including a second terminal,
   a first capacitor including a first terminal coupled to the second terminal of the first resistor and including a second terminal, and
   a second resistor including a first terminal coupled to the second terminal of the first capacitor and including a second terminal, wherein the bias circuit comprises:
   a third resistor including a first terminal coupled to a reference voltage terminal and including a second terminal coupled to the second terminal of the second resistor,
   a first transistor including a collector coupled to the second terminal of the third resistor, including a base coupled to said collector, and including an emitter, and
   a fourth resistor including a first terminal coupled to the emitter of the first transistor and including a second terminal coupled to a ground terminal, wherein the detection circuit comprises:
   a second transistor including a collector coupled to a voltage supply terminal, including a base coupled to the first terminal of the second resistor, and including an emitter,
   a fifth resistor including a first terminal coupled to the emitter of the second transistor and including a second terminal coupled to the ground terminal,
   a second capacitor including a first terminal coupled to the collector of the second transistor and including a second terminal coupled to the ground terminal, and
   a sixth resistor including a first terminal coupled to the collector of the second transistor and including a second terminal for providing the detector voltage output, wherein the power amplifier comprises a driver stage and a power stage, wherein the driver stage comprises:
   a third capacitor including a first terminal for receiving an RF power signal and including a second terminal,
   a seventh resistor including a first terminal coupled to the second terminal of the third capacitor and including a second terminal coupled to a power control voltage terminal for receiving the power control voltage from the detection circuit,
   a third transistor including a base coupled to the second terminal of the first capacitor, including an emitter coupled to the ground terminal and including a collector coupled to a detector power input terminal for providing the RF signal to the detection power input circuit, and
   a first inductor including a first terminal coupled to the collector of the third transistor and including a second terminal coupled to the voltage supply terminal, wherein the power stage comprises:
   a fourth capacitor including a first terminal coupled to the collector of the third transistor and including a second terminal,
   an eighth resistor including a first terminal coupled to the second terminal of the fourth capacitor and including a second terminal coupled to the second terminal of the seventh resistor,
   a fourth transistor including a base coupled to the second terminal of the fourth capacitor, including an emitter coupled to the ground terminal, and including a collector,
   a second inductor including a first terminal coupled to the collector of the fourth transistor and including a second terminal coupled to the voltage supply terminal, and
   a filter coupled between the collector of the fourth transistor and an RF power output terminal for providing an RF power output signal.

4. The power detector of claim 3, wherein the filter comprises:

a fifth capacitor including a first terminal coupled to the collector of the fourth transistor and including a second terminal coupled to the ground terminal, a third inductor including a first terminal coupled to the collector of the fourth transistor and including a second terminal coupled to the RF power output terminal, and a sixth capacitor including a first terminal coupled to the second terminal of the third inductor and including a second terminal coupled to the ground terminal.

* * * * *